(12) United States Patent
Lin

(10) Patent No.: US 7,026,226 B1
(45) Date of Patent: Apr. 11, 2006

(54) METHOD OF HYDROGENATING A POLY-SILICON LAYER

(75) Inventor: Frank Lin, Hsinchu (TW)

(73) Assignee: Toppoly Optoelectronics Corp., (TW)

( * ) Notice: Subject to any disclaimer, the term of this patent is extended or adjusted under 35 U.S.C. 154(b) by 0 days.

(21) Appl. No.: 10/978,380

(22) Filed: Nov. 2, 2004

(51) Int. Cl.
*H01L 21/322* (2006.01)
(52) U.S. Cl. .................. 438/474; 438/473; 438/488
(58) Field of Classification Search ........... 438/474, 438/473, 477, 488, 502, 509, 513, 680, 149, 438/153
See application file for complete search history.

(56) References Cited

U.S. PATENT DOCUMENTS 5,466,617 A * 11/1995 Shannon .............. 438/155
6,888,200 B1 * 5/2005 Bhattacharyya ........... 257/348
2004/0229444 A1 * 11/2004 Couillard et al. ......... 438/455

* cited by examiner

*Primary Examiner*—David Nhu
(74) *Attorney, Agent, or Firm*—Harness, Dickey & Pierce, P.L.C.

(57) ABSTRACT

A method of hydrogenating a poly-silicon layer is disclosed, which is used to improve characteristics of a thin film transistor (TFT) having a poly-silicon thin film. In the method, the poly-silicon layer is first subject to a plasma pre-process and then a hydrogenating process is undertaken thereon where a hydrogen-containing silicon-based compound is deposited over the poly-silicon layer having being pre-processed by the plasma and thermal treated. As such, the hydrogen atoms in the hydrogen-containing silicon-based compound may diffuse into the poly-silicon layer and the hydrogen atoms at a surface of the poly-silicon layer may further diffuse into where need to be filled to promote the hydrogenation effect of the poly-silicon layer, i.e., the hydrogenation may be completed in a shorter time.

13 Claims, 1 Drawing Sheet

METHOD OF HYDROGENATING A POLY-SILICON LAYER

BACKGROUND OF THE INVENTION

1. Field of Invention

The present invention relates to a method of improving characteristics of a thin film transistor (TFT), and particularly to a method of hydrogenating a poly-silicon layer.

2. Related Art

Low temperature poly-silicon (LTPS) technology is used to manufacture a thin film transistor (TFT) display of the new generation. Compared to the conventional amorphous silicon (a-Si) TFT, the LTPS display has a main difference in manufacturing: the LTPS display must have an anneal process where an a-Si thin film is transformed into a poly-silicon layer. With the annealing process, the mobility of carriers of the TFT may be increased up to 200 times. Further, the TFT has the advantages of high response speed, high luminance and high resolution. Therefore, the LPTS technology is considered as an indispensable technology for manufacturing the new-generation TFT display.

For the present, the manufacturing of the LTPS TFT display does not have a satisfactory yield, which is limited by the poor stability of the annealing process with a laser. Since the stability of the energy output of the laser and the manufacturing yield are low, a hydrogenation process must be applied to the succeeding process of the LTPS TFT to improve the yield and achieve mass production of the same. However, the whole process of manufacturing the TFT display is hard to control and needs a lengthy process time. Therefore, the hydrogenation technology is a critical process in improving characteristics of the LTPS TFT display.

So far, many hydrogenation technologies have been introduced. Of the hydrogenation technologies, the solid hydrogenation process and the plasma process are the most frequently used. The solid hydrogenation process is conducted by depositing a hydrogen-rich containing layer, such as a silicon nitride layer containing hydrogen ($SiN_x$:H) onto the poly-silicon layer along with a thermal treatment. The hydrogen atoms diffuse into the poly-silicon layer and occupy some regions that are defects in the poly-silicon layer. The plasma process is undertaken to processing a substrate with a hydrogen-containing plasma where the de-ionized hydrogen from the plasma diffuses into the poly-silicon layer and occupies where it needs to be filled in the poly-silicon layer. However, both of the two-hydrogenation technologies need a long time to complete and thus increase the manufacturing costs of the TFT display.

SUMMARY OF THE INVENTION

In view of the problems encountered in the prior art, the present invention provides a method of hydrogenating a poly-silicon layer to improve characteristics of a poly-silicon TFT, in which the poly-silicon layer is subject to a plasma pre-process and then a hydrogenation process to promote the hydrogenation efficiency of the poly-silicon layer.

The method according to the present invention may be implemented together with a thin film deposition system such as a plasma enhanced chemical vapor deposition (PECVD) system. The method comprises the steps of: providing a substrate with a poly-silicon layer; exciting a hydrogen-containing gas to produce a hydrogen-containing plasma; surface treating a surface of the poly-silicon layer of the substrate with the hydrogen-containing plasma; depositing a hydrogen-containing silicon-based compound on the surface of the poly-silicon layer; and thermal treating the hydrogen-containing silicon-based compound on the surface of the poly-silicon.

To enable one to further realize the object and result of the present invention, the detailed description of the present invention is given as follows.

BRIEF DESCRIPTION OF THE DRAWINGS

The invention will become more fully understood from the detailed description given in the illustration below only, and thus does not limit the present invention, wherein.

DETAILED DESCRIPTION OF THE INVENTION

Figure 1:
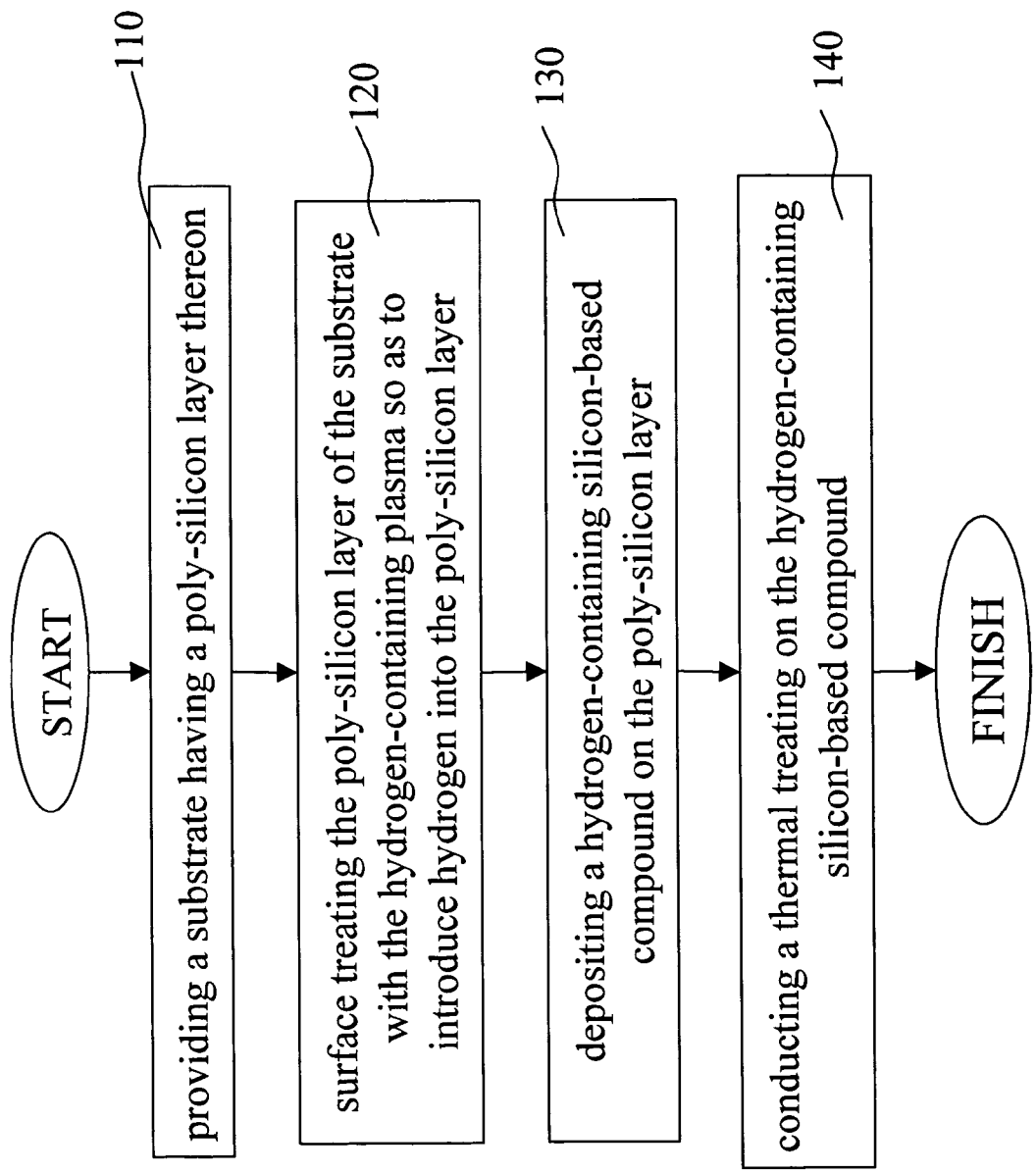
FIG. 1 is a flow chart of a process of an embodiment according to the present invention.

The method of manufacturing a silicon oxide thin film according to the present invention may be used to improve characteristics of a poly-silicon transistor. Referring to FIG. 1, FIG. 1 is a flow chart of a process of an embodiment according to the present invention. First, providing a substrate having a poly-silicon layer thereon (step 110); surface treating the poly-silicon layer of the substrate with the hydrogen-containing plasma so as to introduce hydrogen into the poly-silicon layer (step 120); depositing a hydrogen-containing silicon-based compound on the poly-silicon layer (step 130); and conducting a thermal treating on the hydrogen-containing silicon-based compound (step 140) to make the hydrogen atoms in the hydrogen-containing silicon-based compound diffuse into the poly-silicon layer.

Specifically, the hydrogen-containing silicon-based compound is a hydrogen-containing silicon nitride ($SiN_x$:H). In step 120, a plasma exciter does the exciting of hydrogen containing to surface treat the poly-silicon layer (step 130), and the hydrogen containing may be hydrogen ($H_2$) or ammonia ($NH_3$). The above steps may be executed in a same process chamber in a thin film deposition system to facilitate the entire process flow of the manufacturing of the silicon oxide product. Since the time for once of substrate load-in, substrate load-out and pre-heating is saved, the whole process may save time up to 25% as compared to the prior method of the solid hydrogenation or the plasma treatment and their accompanying successive thermal treatment.

The hydrogen-containing plasma is excited under the conditions of a flow rate of the hydrogen-containing gas of 100 to 10000 sccm (standard cubic centimeter per minute), an input power of a radio frequency of about 100 to 5000 watts and a process chamber pressure of about 0.1 to 10 torrs. The thin film deposition system may be a plasma-enhanced chemical vapor deposition system. In this case, the deposition of the thin film may be conducted by use of a same plasma exciter. Next, using the reaction of $SiH_4$ and $NH_3$ to deposit a hydrogen-containing silicon-based compound on the surface of the poly-silicon layer. In the deposition of the hydrogen-containing silicon-based compound, the conditions are a flow rate of the $SiH_4$ gas of 50 to 5000 sccm, a flow rate of the $NH_3$ gas of about 100 to 15000 sccm, an input power of about 100 to 5000 watts and the pressure of a process chamber of about 0.1 to 10 torrs. Finally, a thermal treatment is undertaken so as to make the hydrogen atoms in the hydrogen-containing silicon-based compound layer diffuse into the poly-silicon layer. The temperature of the thermal treatment is higher than 400° C. and the time for the thermal treatment may be adjusted by the extent of hydrogenation as desired. The longer the thermal treatment is undertaken, the better the hydrogenating result is while the worse the real production is. However, since a plasma hydrogenation process has been previously conducted according to the present invention, the required time of thermal treatment may be shortened. Besides, the obtained hydrogenating result is better than that obtained through the prior art.

In the embodiments in the present invention, the utilized thin film deposition system is a plasma-enhanced chemical vapor deposition (PECVD) system and a surface treatment and the thin film deposition may be undertaken in a same process chamber by use of a same plasma exciter without any other equipment cost. The PECVD system may be selected from the group consisting of a RF-PECVD system, an electron cyclotron resonance CVD system, an ECR-CVD system, a remote plasma CVD system, a magnetic plasma CVD system and their combinations.

Knowing the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of hydrogenating a poly-silicon layer in a thin film transistor (TFT), comprising the steps of:
   providing a substrate having a poly-silicon layer;
   treating a surface of said poly-silicon layer with a hydrogen-containing plasma so as to introduce hydrogen into said poly-silicon layer;
   depositing a hydrogen-containing silicon-based compound on said poly-silicon; and
   conducting a thermal treating on said hydrogen-containing silicon-based compound.

2. The method according to claim 1, wherein said hydrogen-containing gas is a hydrogen gas.

3. The method according to claim 1, wherein said hydrogen-containing gas is an ammonia gas.

4. The method according to claim 1, wherein said hydrogen-containing silicon-based compound is a hydrogen-containing silicon nitride ($SiN_x$:H).

5. The method according to claim 1, wherein said step of exciting said hydrogen-containing gas to produce a hydrogen-containing plasma is executed by a plasma exciter.

6. The method according to claim 1, wherein said steps of treating said poly-silicon layer and depositing a hydrogen silicon-based compound over said surface of said poly-silicon layer are both executed in a same process chamber.

7. The method according to claim 1, wherein said substrate is placed in a thin film deposition system.

8. The method according to claim 1, wherein said thin film deposition system is a plasma-enhanced chemical vapor deposition (PECVD) system.

9. The method according to claim 8, wherein said plasma-enhanced chemical vapor deposition system is a radio frequency plasma-enhanced chemical vapor deposition (RF-PECVD) system.

10. The method according to claim 8, wherein said plasma-enhanced chemical vapor deposition system is an electron cyclotron resonance chemical vapor deposition (ECR-CVD) system.

11. The method according to claim 8, wherein said plasma-enhanced chemical vapor deposition system is a remote plasma chemical vapor deposition system.

12. The method according to claim 8, wherein said plasma-enhanced chemical vapor deposition system is a magnetic plasma chemical vapor deposition.

13. The method according to claim 1, wherein said step of conducting a thermal treating is conducted before a formation of an gate insulating layer.

* * * * *